United States Patent
LiCausi

(10) Patent No.: US 8,557,675 B2
(45) Date of Patent: Oct. 15, 2013

(54) METHODS OF PATTERNING FEATURES IN A STRUCTURE USING MULTIPLE SIDEWALL IMAGE TRANSFER TECHNIQUE

(75) Inventor: Nicholas V. LiCausi, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 42 days.

(21) Appl. No.: 13/305,303

(22) Filed: Nov. 28, 2011

(65) Prior Publication Data

US 2013/0134486 A1    May 30, 2013

(51) Int. Cl.
*H01L 29/06* (2006.01)
*H01L 21/033* (2006.01)

(52) U.S. Cl.
USPC ...... 438/401; 438/714; 257/48; 257/E29.242; 257/E21.038; 257/E21.039

(58) Field of Classification Search
None
See application file for complete search history.

(56) References Cited

U.S. PATENT DOCUMENTS

| | | | |
|---|---|---|---|
| 4,648,937 A | 3/1987 | Ogura et al. | |
| 4,689,869 A | 9/1987 | Jambotkar et al. | |
| 4,808,545 A | 2/1989 | Balasubramanyam et al. | |
| 5,460,991 A | 10/1995 | Hong | |
| 5,885,425 A | 3/1999 | Hsieh et al. | |
| 6,566,759 B1 | 5/2003 | Conrad et al. | |
| 6,875,703 B1 | 4/2005 | Furukawa et al. | |
| 6,949,458 B2 | 9/2005 | Conrad et al. | |
| 7,265,013 B2 | 9/2007 | Furukawa et al. | |
| 7,301,210 B2 | 11/2007 | Abadeer et al. | |
| 7,381,655 B2 | 6/2008 | Furukawa et al. | |
| 7,439,144 B2 | 10/2008 | Doris et al. | |
| 7,470,570 B2 | 12/2008 | Beintner et al. | |
| 7,699,996 B2 | 4/2010 | Furukawa et al. | |
| 7,763,531 B2 | 7/2010 | Abadeer et al. | |
| 7,847,323 B2 | 12/2010 | Cheng et al. | |
| 7,972,959 B2 | 7/2011 | Mebarki et al. | |
| 7,989,355 B2 | 8/2011 | Shieh et al. | |
| 7,998,357 B2 | 8/2011 | Cho et al. | |
| 8,003,236 B2 | 8/2011 | Albrecht et al. | |
| 8,084,310 B2 | 12/2011 | Mebarki et al. | |

(Continued)

OTHER PUBLICATIONS

Sematech Panel Discussion downloaded from URL <http://www.sematech.org/meetings/archives/litho/8065/pres/D3%20Panel%20Discussion.pdf> on Feb. 20, 2013.*

(Continued)

*Primary Examiner* — Thomas L Dickey
*Assistant Examiner* — Joseph Schoenholtz
(74) *Attorney, Agent, or Firm* — Williams, Morgan & Amerson, P.C.

(57) ABSTRACT

Disclosed herein are methods of patterning features in a structure, such as a layer of material used in forming integrated circuit devices or in a semiconducting substrate, using a multiple sidewall image transfer technique. In one example, the method includes forming a first mandrel above a structure, forming a plurality of first spacers adjacent the first mandrel, forming a plurality of second mandrels adjacent one of the first spacers, and forming a plurality of second spacers adjacent one of the second mandrels. The method also includes performing at least one etching process to selectively remove the first mandrel and the second mandrels relative to the first spacers and the second spacers and thereby define an etch mask comprised of the first spacers and the second spacer and performing at least one etching process through the etch mask on the structure to define a plurality of features in the structure.

22 Claims, 8 Drawing Sheets

(56) References Cited

U.S. PATENT DOCUMENTS

| | | |
|---|---|---|
| 8,389,383 B1 | 3/2013 | Hopkins |
| 2003/0115750 A1 | 6/2003 | Conrad et al. |
| 2006/0046382 A1 | 3/2006 | Yoon et al. |
| 2006/0084243 A1 | 4/2006 | Zhang et al. |
| 2007/0284669 A1 | 12/2007 | Abadeer et al. |
| 2008/0188080 A1 | 8/2008 | Furukawa et al. |
| 2008/0286971 A1 | 11/2008 | Doris et al. |
| 2008/0315746 A1 | 12/2008 | Gosain et al. |
| 2009/0090975 A1 | 4/2009 | Ong et al. |
| 2009/0101995 A1 | 4/2009 | Beintner et al. |
| 2009/0309162 A1* | 12/2009 | Baumgartner et al. ....... 257/368 |
| 2011/0014791 A1* | 1/2011 | Johnson et al. ............... 438/696 |
| 2011/0021010 A1* | 1/2011 | Cheng et al. .................. 438/513 |
| 2011/0111596 A1 | 5/2011 | Kanakasabapathy |
| 2011/0113393 A1 | 5/2011 | Sezginer |
| 2011/0117743 A1* | 5/2011 | Bai et al. ....................... 438/696 |
| 2012/0122315 A1 | 5/2012 | Booth, Jr. et al. |
| 2012/0258587 A1 | 10/2012 | Kub et al. |

OTHER PUBLICATIONS

Medeiros D., "Lithograph on the Edge", 6th International Symposium on Immersion Lithography Extensions, Prague Czech Republic, Oct. 23, 2009.*

Zimmerman, "Double patterning lithography: double the trouble or double the fun?," SPIE Newsroom, 2009.

Chen et al., "Self-Aligned Triple Patterning for Continuous IC Scaling to Half-Pitch 15nm," Proc. of SPIE, vol. 7973, Mar. 22, 2011.

Chen et al., "Mandrel and Spacer Engineering Based Self-aligned Triple Patterning," Proc. of SPIE, vol. 8328, Apr. 16, 2012.

Chen et al., "Self-Aligned Triple Patterning to Extend Optical Lithography for 1× Patterning," Presentation from International Symposium on Lithography Extensions, Oct. 21, 2010.

Mebarki et al., "Innovative Self-Aligned Triple Patterning for 1× half pitch using Single 'Spacer Deposition-Spacer Etch step," Proc. of SPIE, vol. 7973, Mar. 22, 2011.

* cited by examiner

METHODS OF PATTERNING FEATURES IN A STRUCTURE USING MULTIPLE SIDEWALL IMAGE TRANSFER TECHNIQUE

BACKGROUND OF THE INVENTION

1. Field of the Invention

Generally, the present disclosure relates to the manufacturing of sophisticated semiconductor devices, and, more specifically, to various methods of patterning features in a structure such as a layer of material used in forming integrated circuit devices or in a semiconducting substrate using a multiple sidewall image transfer technique.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Numerous processing operations are performed in a very detailed sequence, or process flow, to form such integrated circuit devices, e.g., deposition processes, etching processes, heating processes, masking operations, etc. In general, the formation of integrated circuit devices involves, among other things, the formation of various layers of material and patterning or removing portions of those layers of material to define a desired structure, such as a gate electrode, a sidewall spacer, etc. Device designers have been very successful in improving the electrical performance capabilities of transistor devices, primarily by reducing the size of or "scaling" various components of the transistor, such as the gate length of the transistors. In fact, device dimension on modern day transistors have been reduced to the point where direct patterning of such features is very difficult using existing 193 nm based photolithography tools and technology. Thus, device designers have employed various techniques to pattern very small features. On such technique is generally known as a sidewall image transfer technique.

FIGS. 1A-1E depict one illustrative example of a prior art sidewall image transfer technique. As shown in FIG. 1A, a mandrel 12 is formed above a structure 10, such as a semiconducting substrate. The mandrel 12 may be made of a variety of materials, e.g., amorphous silicon, polysilicon, etc. The size of the mandrel 12 may vary depending upon the particular applications. The mandrel 12 may be formed be depositing and patterning a layer of mandrel material using known deposition, photolithography and etching tools and techniques. Next as shown in FIG. 1B, a layer of spacer material 14 is conformably deposited above the mandrel 12 and the structure 10. The layer of spacer material 14 may be comprised of a variety of materials such as, for example, silicon nitride, silicon dioxide, etc. As reflected in FIG. 1C, an anisotropic etching process is performed to define spacers 14A adjacent the mandrel 12. Then as shown in FIG. 1D, the mandrel 12 is removed by performing a selective etching process that leaves the spacers 14A to act as masks in a subsequent etching process that defines feature 18 in the structure 10, as depicted in FIG. 1E.

The present disclosure is directed to various methods of patterning features in a structure, such as a layer of material used in forming integrated circuit devices or in a semiconducting substrate, using a multiple sidewall image transfer technique.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of patterning features in a structure such as a layer of material used in forming integrated circuit devices or in a semiconducting substrate using a multiple sidewall image transfer technique. In one example, the method includes forming a first mandrel above a structure, forming a plurality of first spacers adjacent the first mandrel, forming a plurality of second mandrels, wherein each of the second mandrels is formed adjacent one of the first spacers, and forming a plurality of second spacers, wherein each of the second spacers is formed adjacent one of the second mandrels. The method also includes the steps of performing at least one etching process to selectively remove the first mandrel and the second mandrels relative to the first spacers and the second spacers and thereby define an etch mask comprised of the first spacers and the second spacer and performing at least one etching process through the etch mask on the structure to define a plurality of features in the structure.

In another illustrative example, a method is disclosed that includes forming a first mandrel above a structure, forming a plurality of first spacers adjacent the first mandrel, wherein each of the first spacers have a first width, and forming a plurality of second mandrels, wherein each of the second mandrels is formed adjacent one of the first spacers. In this embodiment, the method includes the additional steps of forming a plurality of second spacers, wherein each of the second spacers is formed adjacent one of the second mandrels and each of the second spacers has a second width that is different from the first width, performing at least one etching process to selectively remove the first mandrel and the second mandrels relative to the first spacers and the second spacers and thereby define an etch mask comprised of the first spacers and the second spacers, and performing at least one etching process through the etch mask on the structure to define a plurality of features in the structure.

BRIEF DESCRIPTION OF THE DRAWINGS

The disclosure may be understood by reference to the following description taken in conjunction with the accompanying drawings, in which like reference numerals identify like elements, and in which.

Figure 1A:
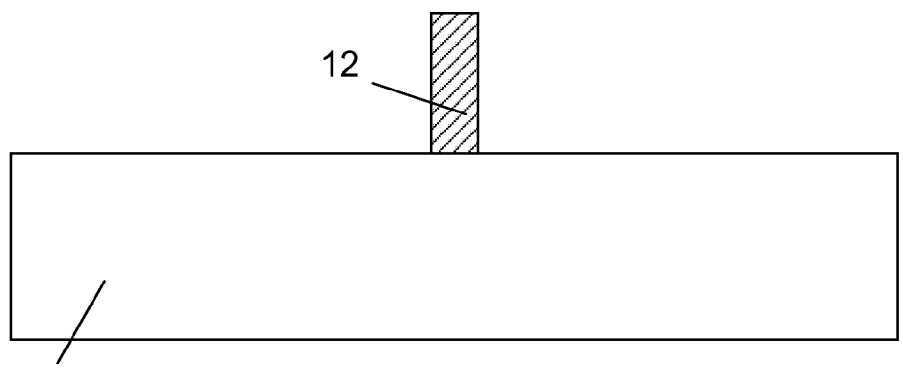
FIGS. 1A-1E depict one illustrative example of a prior art sidewall image transfer technique.
Figure 1B:
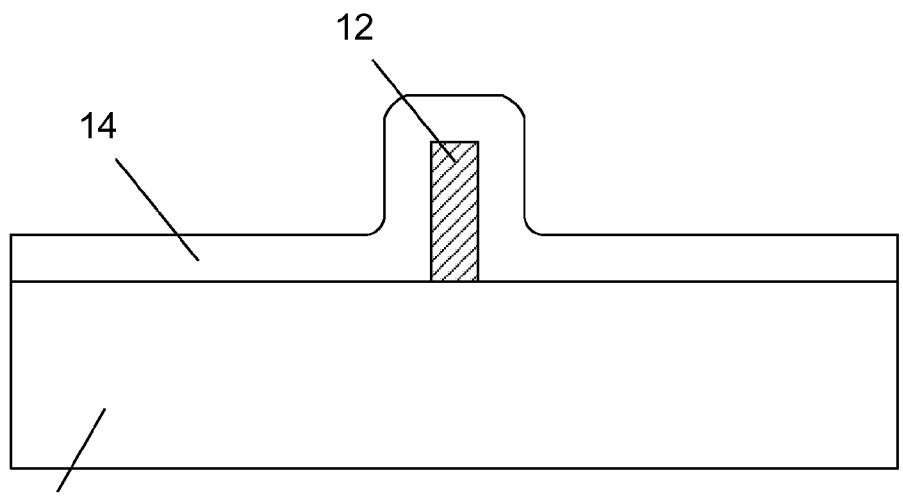
Figure 1C:
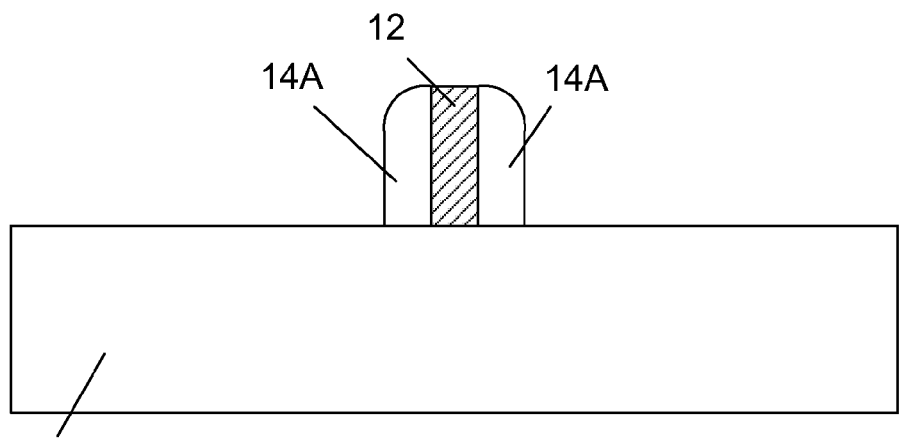
Figure 1D:
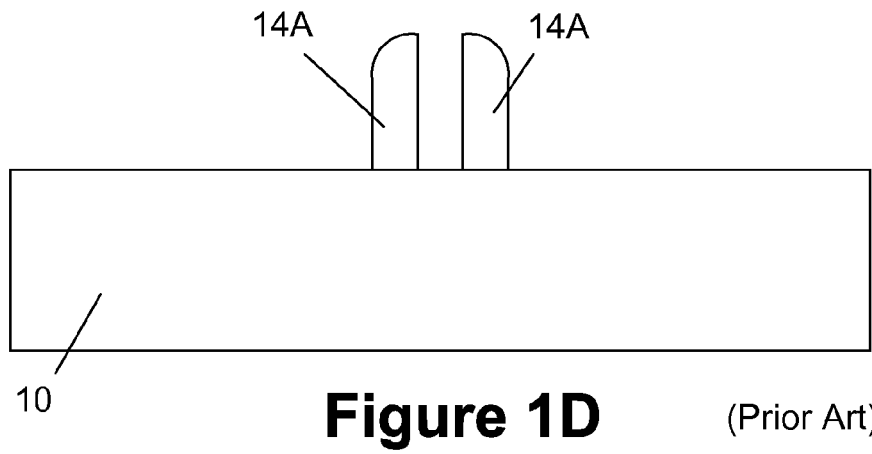
Figure 1E:
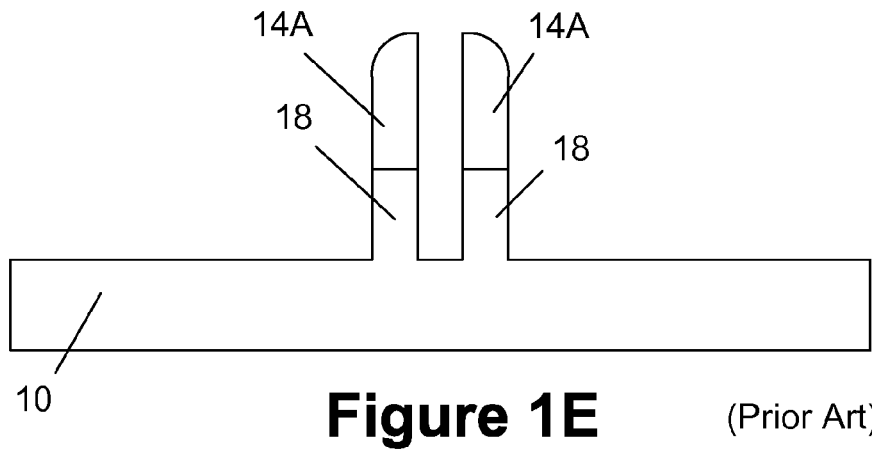

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of patterning features in a structure such as a layer of material used in forming integrated circuit devices or in a semiconducting substrate using a multiple sidewall image transfer technique. As will be readily apparent to those skilled in the art upon a complete reading of the present application, the present method is applicable to a variety of devices, including, but not limited to, ASICs, logic devices, memory devices, etc. Moreover, the present invention may be employed in forming any of a variety of different types of features formed on an integrated circuit product, such as lines, trenches, gate electrode structures, fins for FinFET devices, etc. With reference to the attached drawings various illustrative embodiments of the methods and devices disclosed herein will now be described in more detail.

Figure 2A:
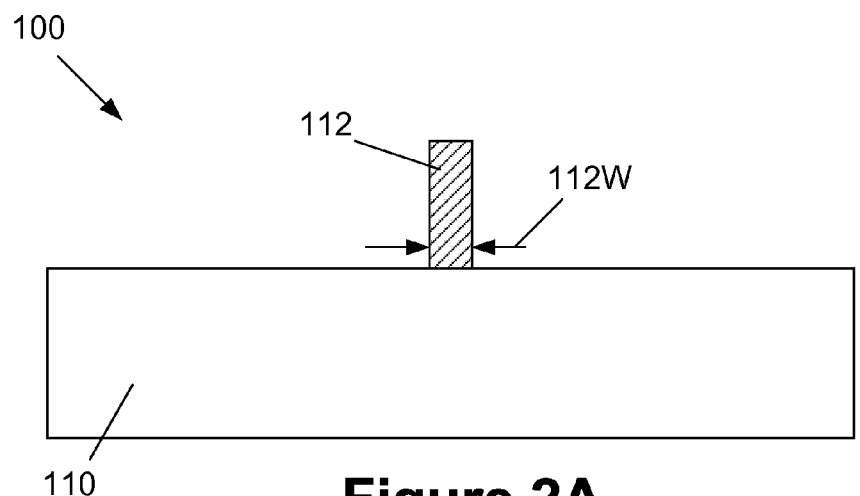
FIGS. 2A-2P depict various illustrative methods disclosed herein for patterning features in a structure such as a layer of material used in forming features of an integrated circuit device or forming features in a semiconducting substrate.

FIGS. 2A-2J depict one illustrative method disclosed herein for forming various features on a structure used in the manufacture of integrated circuit devices. As shown in FIG. 2A, a first mandrel 112 is formed above a structure 110. The structure 110 is intended to be representative of any type of structure or layer of material that may be employed in manufacturing integrated circuit products. For example, the structure 110 may be a semiconducting substrate, a layer of metal, a layer of silicon nitride, a layer of polysilicon, a layer of gate electrode material, etc. The first mandrel 112 may be made of a variety of materials, e.g., amorphous silicon, polysilicon, etc. The size of the first mandrel 112 may vary depending upon the particular applications. For example, in one illustrative embodiment, the first mandrel 112 may have a height of about 80 nm and a width 112W of about 40 nm. The first mandrel 112 may be formed be depositing and patterning a layer of mandrel material using known deposition, photolithography and etching tools and techniques.

Figure 2B:
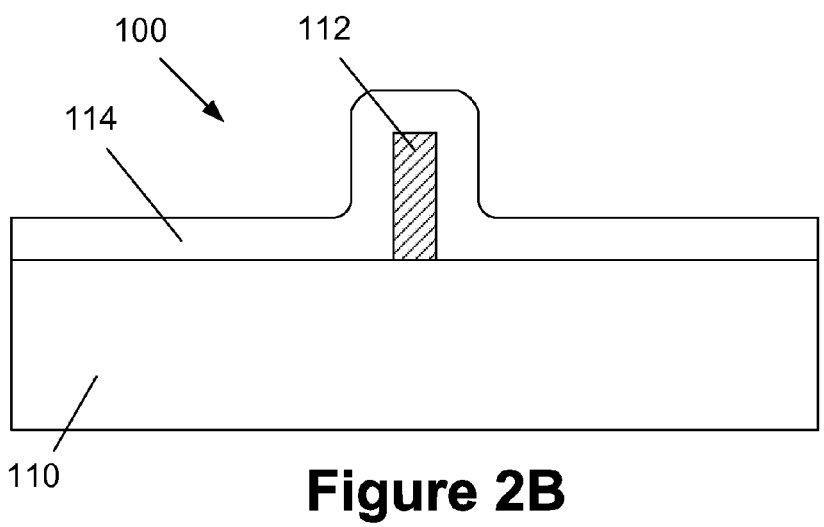

Next as shown in FIG. 2B, a first layer of spacer material 114 is conformably deposited above the first mandrel 112 and the structure 110. The first layer of spacer material 114 may be comprised of a variety of materials such as, for example, silicon nitride, silicon dioxide, etc. The thickness of the first layer of spacer material 114 may vary depending upon the size of the features to be formed in the structure 110, as described more fully below.

Figure 2C:
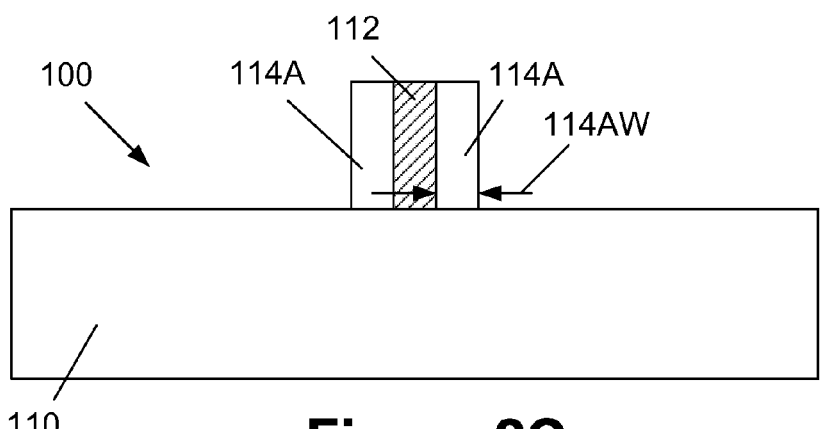

Next, as shown in FIG. 2C, an anisotropic etching process is performed on the first layer of spacer material 114 to define a plurality of first spacers 114A adjacent the first mandrel 112. In one illustrative embodiment, the width 114AW of the first spacers 114A may be about 10-25 nm.

Figure 2D:
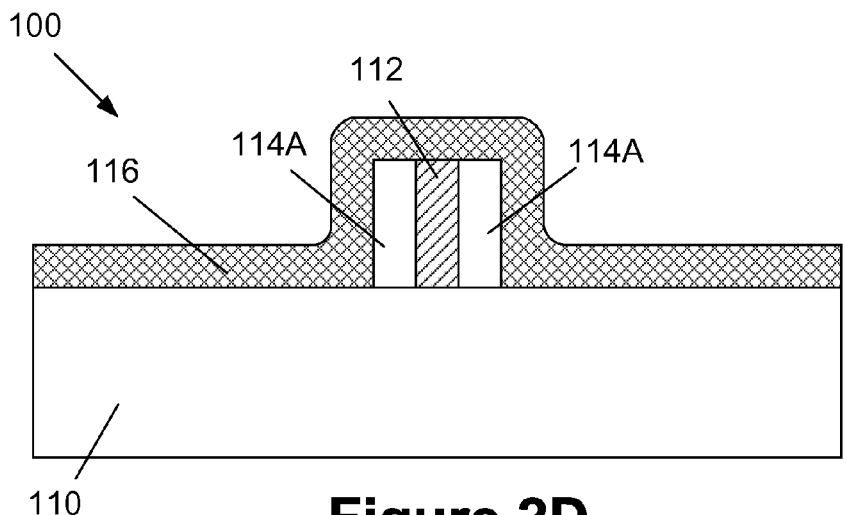

Next, as shown in FIG. 2D, a layer of mandrel material 116 is conformably deposited above the first mandrel 112 and the first spacers 114A. The layer of mandrel material 116 may be comprised of a variety of materials such as, for example, amorphous silicon, polysilicon, etc. The thickness of the layer of mandrel material 116 may vary depending upon the size of the features to be formed in the structure 110, as described more fully below. The layer of mandrel material 116 may be made of the same material as the first mandrel 112, although that is not required.

Figure 2E:
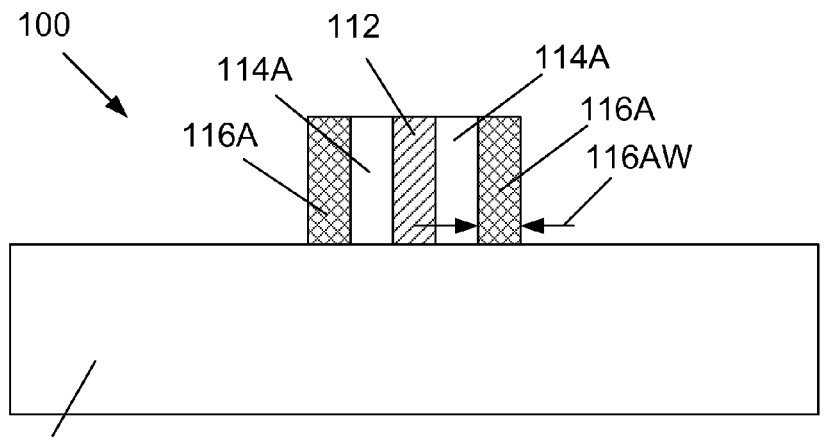

Next, as shown in FIG. 2E, an anisotropic etching process is performed on the layer of mandrel material 116 to define a plurality of second mandrels 116A adjacent the first spacers 114A. The second mandrels 116A have a width 116AW that may be the same as the width 112W of the first mandrel 112 or they may have a different width, i.e., the width 116AW may be wider or narrower than the width 112W. In one illustrative embodiment, the width 116AW of the second mandrels 116A may be about 20-40 nm.

Figure 2F:
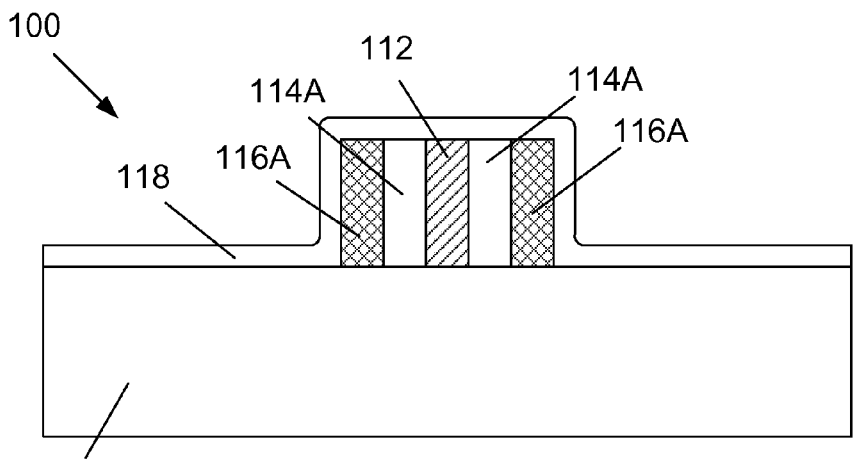

Next as shown in FIG. 2F, a second layer of spacer material 118 is conformably deposited above the various structures depicted in FIG. 2E. The second layer of spacer material 118 may be comprised of a variety of materials such as, for example, silicon nitride, silicon dioxide, etc. The thickness of the second layer of spacer material 118 may vary depending upon the size of the features to be formed in the structure 110, as described more fully below. The second layer of spacer material 118 may be made of the same material as the first layer of spacer material 114, although that is not required.

Figure 2G:
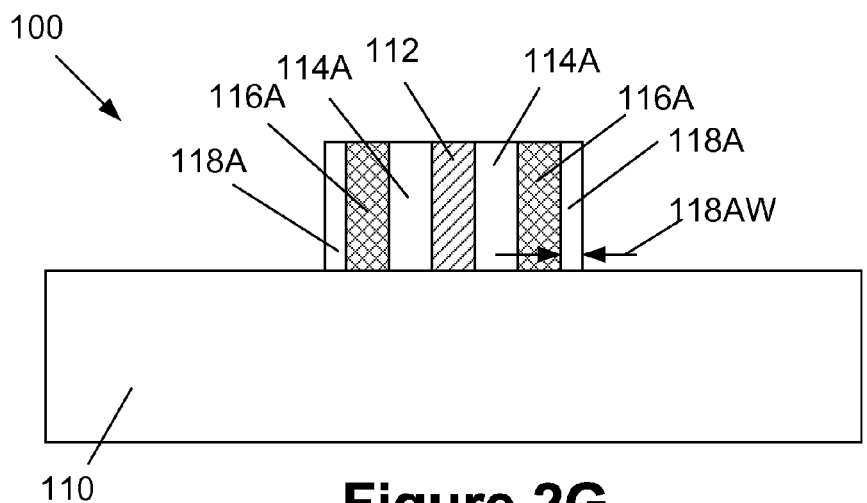

Next, as shown in FIG. 2G, an anisotropic etching process is performed on the second layer of spacer material 118 to define a plurality of second spacers 118A adjacent each of the second spacers 114A. In one illustrative embodiment, the width 118AW of the second spacers 118A may be about 5-15 nm. In one illustrative, embodiment disclosed herein the width 118AW of the second spacers 118A may be different than the width 114A of the first spacers 114A so that features of different sizes may be formed in the structure 110. In other embodiments disclosed herein, the width 118AW of the second spacers 118A may be approximately the same as or wider than the width 114A of the first spacers 114A.

Figure 2H:
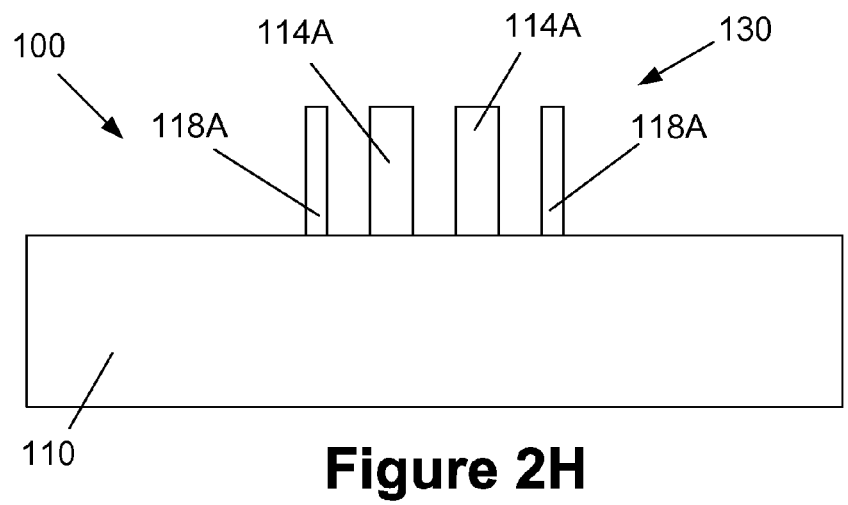

Then, as shown in FIG. 2H, one or more etching processes is performed to selectively remove the first mandrel 112 and the second mandrels 116 relative to the first spacers 114A and the second spacers 118A. The first spacers 114A and the second spacers 118A define an etch mask 130 that may be employed in defining various features 120 in the structure 110, as described more fully below.

Figure 2I:
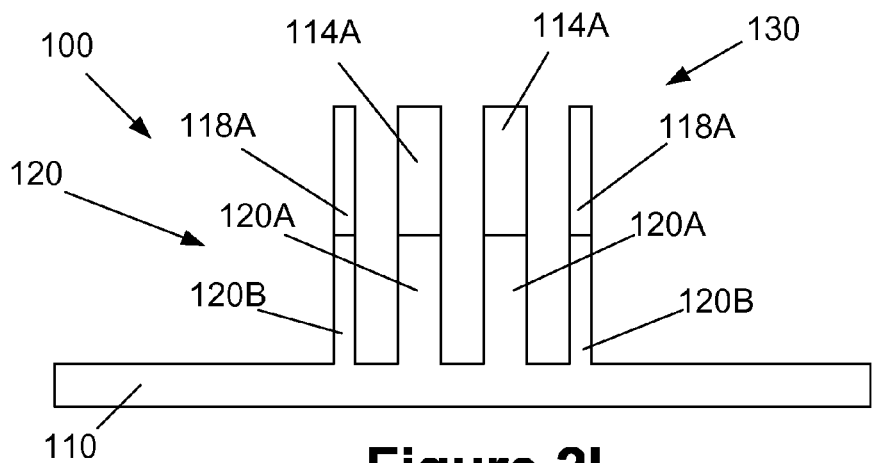
Figure 2J:
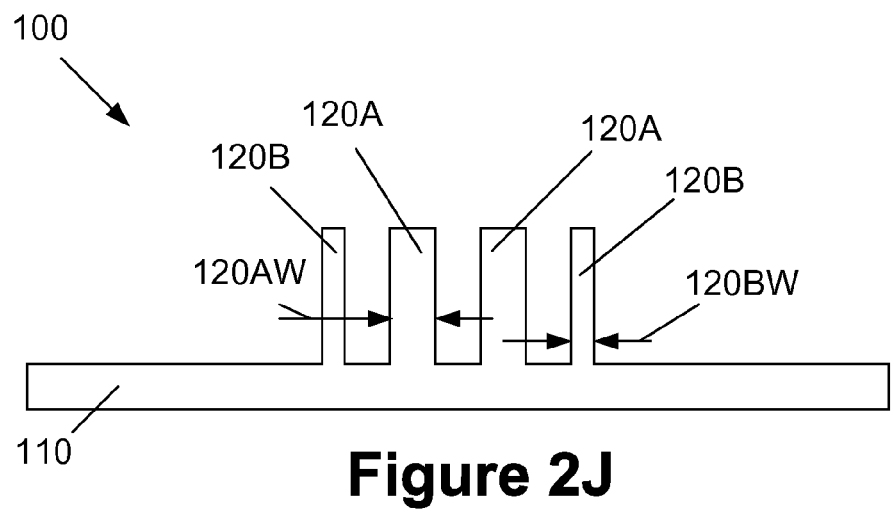

FIG. 2I reflects the device after an etching process, either a wet or dry etching process, has been performed on the structure 110 through the mask layer 130 to define a plurality of features 120 in the structure 110. As noted above, using the methods disclosed herein a variety of different types of features may be formed, e.g., lines, trenches, gate electrode structures, fins for FinFET devices, etc. Thus, the particular invention should not be considered as limited to any particular type of feature. In the illustrative embodiment depicted herein, a plurality of features 120A, 120B are formed in the structure 110. FIG. 2J depicts the device 100 after the mask layer 130 has been stripped. In the embodiment disclosed herein, the features 120A (corresponding to the first spacers 114A) have a greater width 120AW than the width 120BW of the features 120B (corresponding to the second spacers 118A).

Figure 2K:
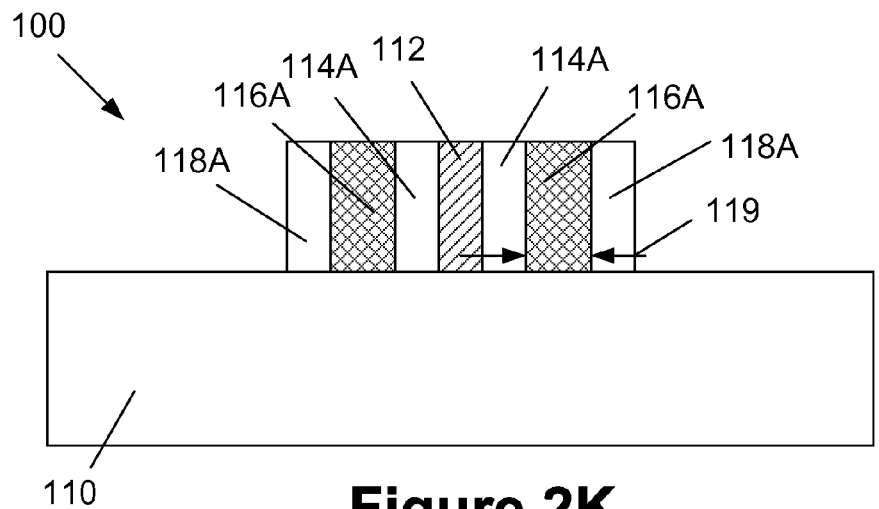
Figure 2L:
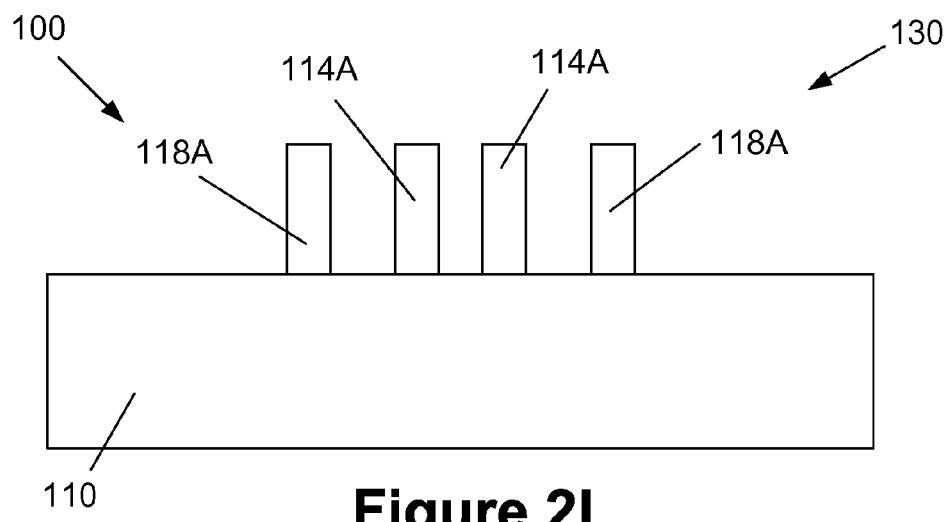
Figure 2M:
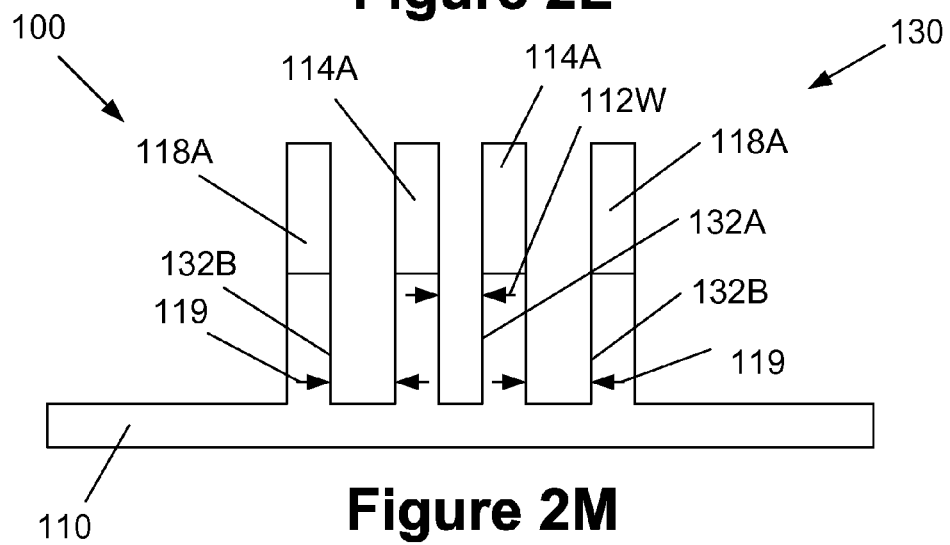

FIGS. 2K-2M disclose another illustrative example wherein the methods disclosed herein may be employed. As shown in FIG. 2K, the width 119 of the second mandrels 116A are wider than the width 112W of the first mandrel 112, while the widths of the first spacers 114A and the second spacers 118A are the same. As shown in FIG. 2L, one or more etching processes are performed to selectively remove the first mandrel 112 and the second mandrels 116 relative to the first spacers 114A and the second spacers 118A. The first spacers 114A and the second spacers 118A define an etch mask 130 that may be employed in defining various features 120 in the structure 110, as described more fully below. FIG. 2M reflects the device 100 after an etching process, either a wet or dry etching process, has been performed on the structure 110 through the mask layer 130 to define a plurality of trench features 132A, 132B in the structure 110. In this illustrative embodiment, the trench 132A has a width 112W that corresponds to the width of the first mandrel 112, while the trenches 132B have a width 119 that corresponds to the width of the second mandrels 116A.

Figure 2N:
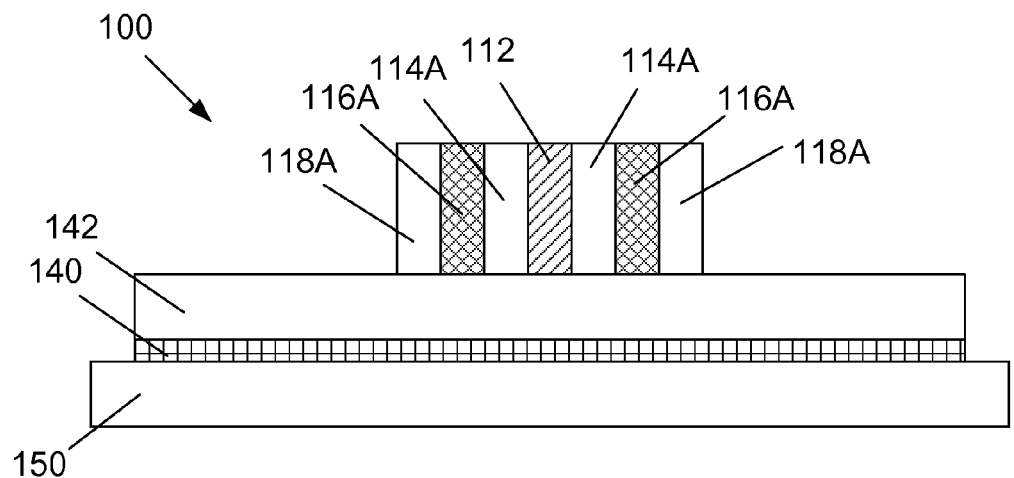
Figure 2O:
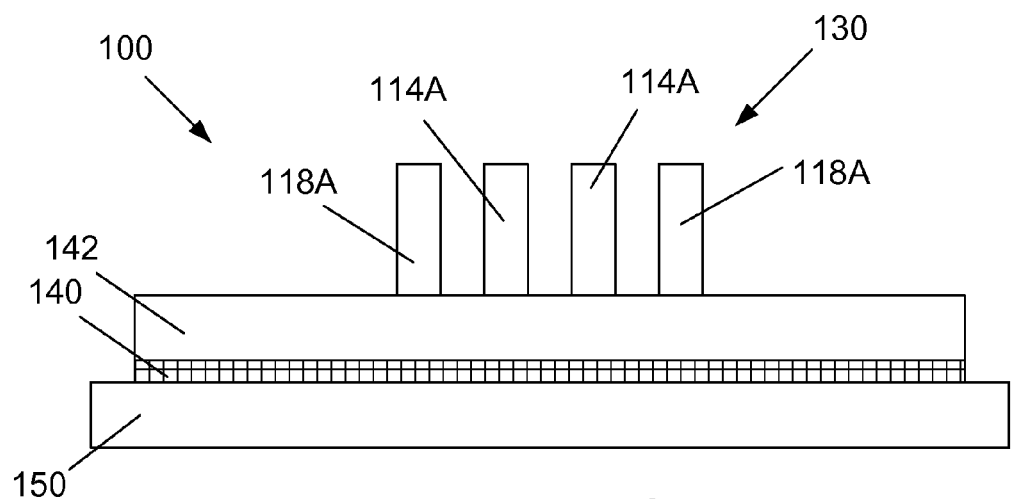
Figure 2P:
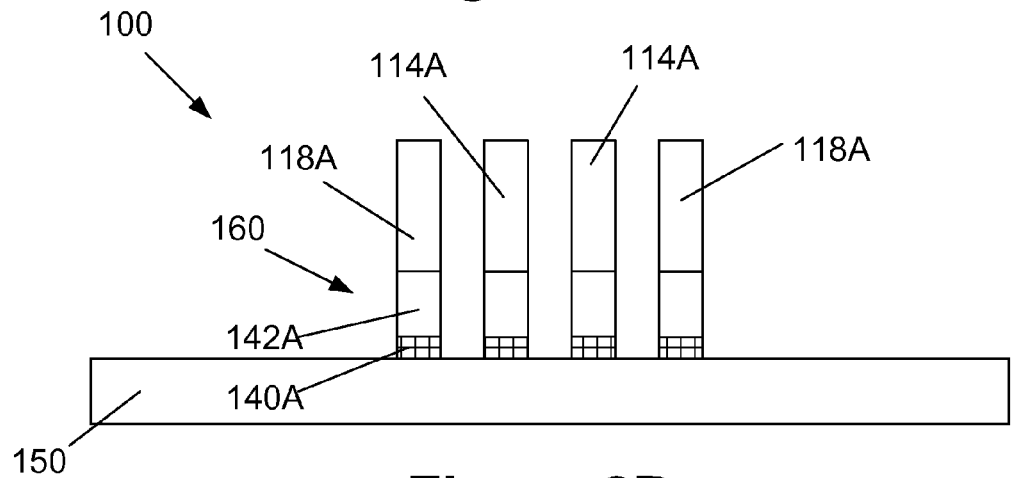

FIGS. 2N-2P depict yet another illustrative example wherein the methods disclosed herein may be employed. As shown in FIG. 2N, the structure 110 may be a layer of gate electrode material 142 that is formed above a gate insulation material layer 140 that is formed above a semiconducting substrate 150. In the example depicted in FIGS. 2N-2P, the first and second mandrels 112, 116A have the same width and the widths of the first spacers 114A and the second spacers 118A are the same. As shown in FIG. 2O, one or more etching processes is performed to selectively remove the first mandrel 112 and the second mandrels 116 relative to the first spacers 114A and the second spacers 118A. The first spacers 114A and the second spacers 118A define an etch mask 130 that may be employed in defining various features in the layer of gate electrode material 142. FIG. 2P reflects the device 100 after one or more etching processes, either a wet or dry etching process, have been performed on at least the layer of gate electrode material 142 to define a plurality of gate electrodes 142A. In the depicted example, an etching process is also performed through the mask layer 130 do pattern the gate insulation material layer 140 and thereby define gate insulation layers 140A. In the depicted embodiment the methods disclosed herein may be employed to define a plurality of gate structures 160 for the device 100, wherein the gate structures 160 are comprised of a gate insulation layer 140A and a gate electrode 142A. In this illustrative example, the gate electrodes 142A have a critical dimension that corresponds to the width of the spacer positioned thereabove.

Figure 3C:
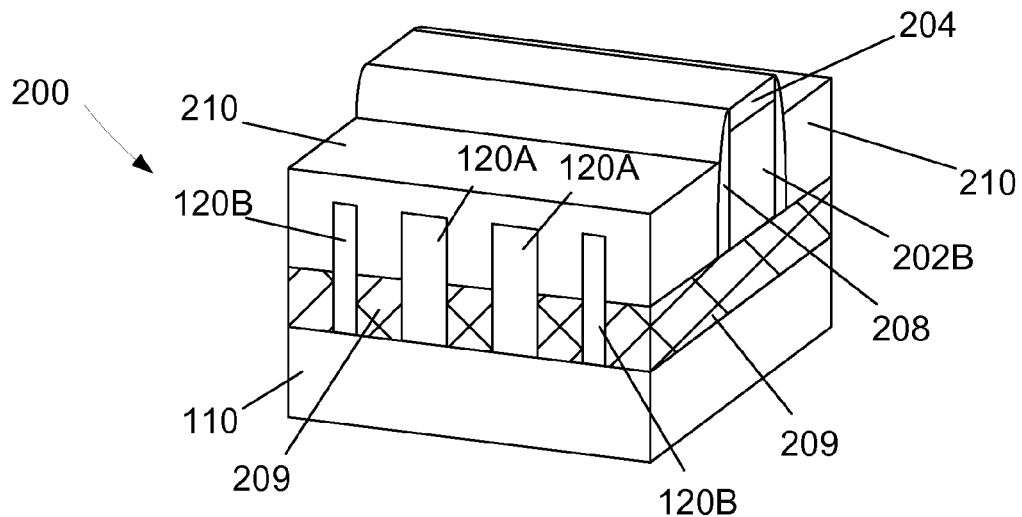
FIGS. 3A-3C depict one illustrative embodiment of a novel illustrative FinFET device that may be formed using the methods disclosed herein.
Figure 3A:
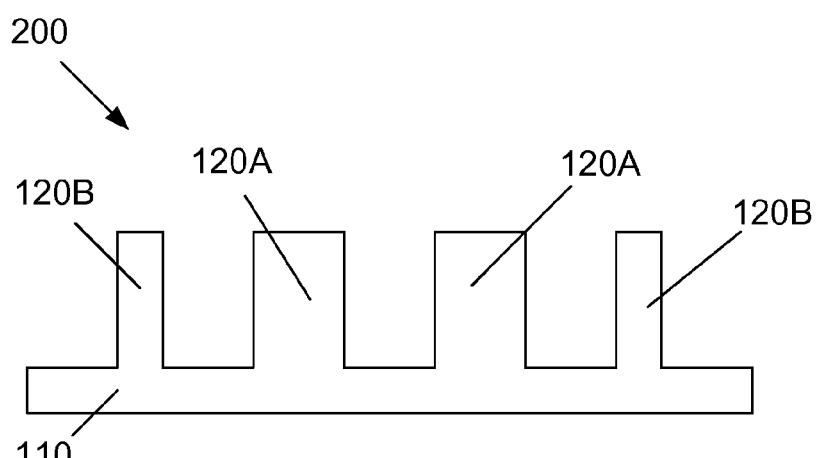
Figure 3B:
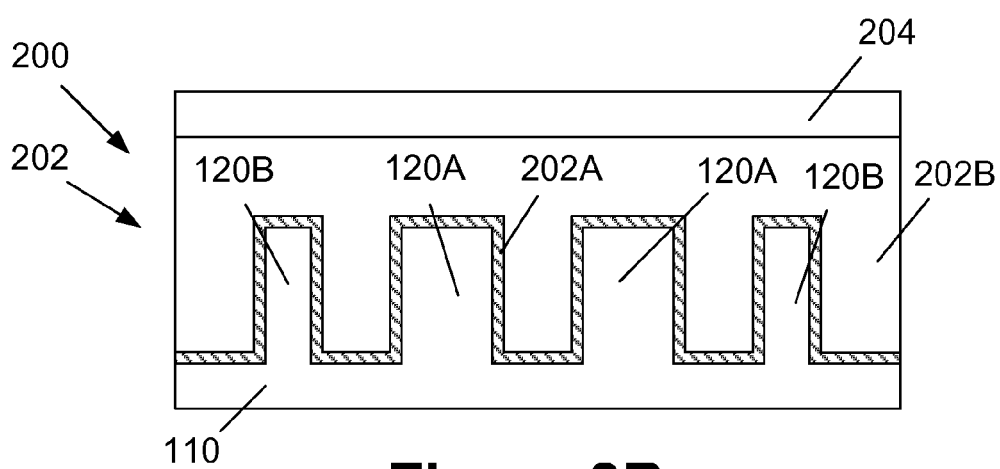

FIGS. 3A-3C depict an illustrative example wherein the methods disclosed herein may be employed to form a FinFET device 200, wherein the features 120A, 120B are fins of the FinFET device 200. As noted above, in some embodiments the features 120A, 120B (or fins) may have different widths. In this example, the structure 110 may be bulk silicon substrate or it may be the active layer of an SOI substrate. The overall size, shape and configuration of the fins 120A, 120B may vary depending on the particular application.

FIG. 3B depicts the FinFET device 200 after several process operations have been performed. For example, an illustrative gate electrode structure 202 is formed for the device 200 using well known techniques. In one illustrative embodiment, the schematically depicted gate structure 202 includes an illustrative gate insulation layer 202A and an illustrative gate electrode 202B. An illustrative gate cap layer 204 is also depicted as being formed above the illustrative gate electrode layer 202B. The gate insulation layer 202A may be comprised of a variety of different materials, such as, for example, silicon dioxide, a so-called high-k (k greater than 10) insulation material, etc. Similarly, the gate electrode 202B may also be of a material such as polysilicon or amorphous silicon, or it may be comprised of one or more metal layers that act as the gate electrode 202B. As will be recognized by those skilled in the art after a complete reading of the present application, the gate structure 202 of the FinFET device 200 depicted in the drawings, i.e., the gate insulation layer 202A and the gate electrode 202B, is intended to be representative in nature. That is, the gate structure 202 may be comprised of a variety of different materials and it may they have a variety of configurations, and the gate structure 202 may be made using either so-called "gate-first" or "replacement metal gate" techniques. In one illustrative embodiment, an oxidation process may be performed to form the illustrative gate insulation layer 202A comprised of silicon dioxide that is depicted in FIG. 3B. Thereafter, the gate electrode material and the gate cap layer material may be deposited above the device 200 and the layers may be patterned using known photolithographic and etching techniques. The gate cap layer 204 may be made of a variety of materials such as, for example, silicon nitride. Typically, sidewall spacers comprised of, for example, silicon nitride, are formed adjacent the gate electrode structure 202 to protect and electrically isolate the gate electrode structure 202, however, such spacers are not shown in FIG. 3B so as not to obscure the inventions disclosed herein.

FIG. 3C is a schematic, perspective view of one illustrative embodiment of the FinFET device 200 at a later stage of fabrication wherein the illustrative fins 120A, 120B intentionally have different target widths, not differences in width due to manufacturing tolerances or errors. Using the techniques disclosed herein the channel width of the FinFET device 200 may be varied as desired by device designers to achieve a desired or target drive current that is required for a particular circuit being designed. That is, using the techniques disclosed herein, a FinFET device may be designed and manufactured to produce a drive current that is different from a FinFET device with fins having a uniform thickness. Moreover, another important parameter of the FinFET device that depends to at least some degree on the width of the fins is the threshold voltage. By using a FinFET device 200 as disclosed herein wherein the widths of the fins may be different, better control of the threshold voltage of the device may be achieved. As noted above, the device 200 includes the gate structure 202 and the gate cap layer 204. At the cross-section depicted in FIG. 3C, the gate insulation layer 202A is not present under the gate electrode 202B. Also depicted in FIG. 3C are an insulating material 209, sidewall spacers 208 and a semiconducting material layer 210 where source/drain regions will be formed for the device 100. The spacers 208 may be formed form a variety of materials such as, for example, silicon nitride, silicon oxynitride, etc. The spacers 208 may be made by conformably depositing a layer of spacer material and thereafter performing an anisotropic etching process. It should be understood that when it is stated in the claims that a spacer is formed adjacent a mandrel or vice-versa, physical contact between the spacer and the mandrel is not required. That is, for example, a liner layer may be formed on the first mandrel 112 prior to forming the first spacers 114A on such a liner layer. In that case, the first spacers 114A should still be understood as being formed adjacent to the first mandrel 112. To the extent that physical contact between a spacer and a mandrel is set forth in the claims, that physical contact will be claimed by reciting that the spacer is formed "on" the mandrel—or vice versa.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first mandrel above a structure;
    forming a plurality of first spacers on said first mandrel;
    forming a plurality of second mandrels, each of said second mandrels being formed on one of said first spacers;
    forming a plurality of second spacers, each of said second spacers being formed on one of said second mandrels;
    performing at least one etching process to selectively remove said first mandrel and said second mandrels relative to said first spacers and said second spacers and thereby define an etch mask comprised of said first spacers and said second spacers; and
    performing at least one etching process through said etch mask on said structure to define a plurality of features in said structure.

2. The method of claim 1, wherein said first spacer has a width that is the same as a width of each of said plurality of second spacers.

3. The method of claim 1, wherein said first spacer has a width that is different from a width of each of and said plurality of second spacers.

4. The method of claim 1, wherein said structure is one of a semiconducting substrate or a layer of material.

5. The method of claim 1, wherein said structure is a semiconducting substrate and wherein said features are fins for a FinFET device.

6. The method of claim 1, wherein said first mandrel has a width that is the same as a width of each of said plurality of second mandrels.

7. The method of claim 1, wherein said first mandrel has a width that is different from a width of each of said plurality of second mandrels.

8. The method of claim 1, wherein said structure is a layer of gate electrode material and wherein said features are gate electrodes.

9. The method of claim 1, wherein said features are lines or trenches.

10. A method, comprising:
    forming a first mandrel above a structure;
    forming a plurality of first spacers on said first mandrel, each of said first spacers having a first width;
    forming a plurality of second mandrels, each of said second mandrels being formed on one of said first spacers;
    forming a plurality of second spacers, each of said second spacers being formed on one of said second mandrels and each of said second spacers having a second width that is different from said first width;
    performing at least one etching process to selectively remove said first mandrel and said second mandrels relative to said first spacers and said second spacers and thereby define an etch mask comprised of said first spacers and said second spacers; and
    performing at least one etching process through said etch mask on said structure to define a plurality of features in said structure.

11. The method of claim 10, wherein said first width is greater than said second width.

12. The method of claim 10, wherein said second width is greater than said first width.

13. The method of claim 10, wherein said structure is one of a semiconducting substrate or a layer of material.

14. The method of claim 10, wherein said structure is a semiconducting substrate and wherein said features are fins for a FinFET device.

15. The method of claim 10, wherein said first mandrel has a width that is the same as a width of each of said plurality of second mandrels.

16. The method of claim 10, wherein said first mandrel has a width that is different from a width of each of said plurality of second mandrels.

17. The method of claim 10, wherein said structure is a layer of gate electrode material and wherein said features are gate electrodes.

18. The method of claim 10, wherein said features are lines or trenches.

19. A method, comprising:
    forming a first mandrel above a structure;
    forming a plurality of first spacers adjacent said first mandrel;
    after forming said plurality of first spacers, forming a plurality of second mandrels, each of said second mandrels being formed adjacent one of said first spacers;
    forming a plurality of second spacers, each of said second spacers being formed adjacent one of said second mandrels;
    performing at least one etching process to selectively remove said first mandrel and said second mandrels relative to said first spacers and said second spacers and thereby define an etch mask comprised of said first spacers and said second spacers; and
    performing at least one etching process through said etch mask on said structure to define a plurality of features in said structure.

20. The method of claim 19, wherein said first spacer has a width that is the same as a width of each of said plurality of second spacers.

21. The method of claim 19, wherein said first spacer has a width that is different from a width of each of and said plurality of second spacers.

22. The method of claim 19, wherein said first mandrel has a width that is different from a width of each of said plurality of second mandrels.

* * * * *